(12) United States Patent
Thomason et al.

(10) Patent No.: US 6,421,221 B1
(45) Date of Patent: Jul. 16, 2002

(54) APPARATUS AND METHOD FOR REDIRECTING ELECTROSTATIC DISCHARGE CURRENTS VIA AN ALTERNATE PATH TO A REFERENCE VOLTAGE NODE

(75) Inventors: Gary S. Thomason, Georgetown; Joseph W. Tannehill, Austin, both of TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/514,556

(22) Filed: Feb. 28, 2000

(51) Int. Cl.[7] .............................................. H01H 47/00
(52) U.S. Cl. ....................................... 361/220; 361/816
(58) Field of Search ................................ 361/111, 119, 361/212, 220–222, 816, 818

(56) References Cited

U.S. PATENT DOCUMENTS

| | | | |
|---|---|---|---|
| 4,667,266 A | 5/1987 | Masuoka et al. ............ 361/212 |
| 4,791,524 A | 12/1988 | Teigen et al. ................ 361/212 |
| 4,837,657 A | 6/1989 | Belanger, Jr. et al. ....... 361/220 |
| 5,365,858 A | 11/1994 | Kuhns ........................ 108/55.3 |
| 5,383,097 A | 1/1995 | DeLucia et al. ............. 361/220 |
| 5,383,098 A | * | 1/1995 | Ma et al. ..................... 361/818 |
| 5,537,294 A | 7/1996 | Siwinski ..................... 361/818 |
| 5,659,245 A | 8/1997 | Ping et al. ................. 324/158.1 |
| 5,796,570 A | 8/1998 | Mekdhanasarn et al. .... 361/126 |
| 5,889,308 A | 3/1999 | Hong et al. .................. 257/355 |
| 5,959,827 A | 9/1999 | Smith et al. ................ 361/212 |

* cited by examiner

*Primary Examiner*—Ronald W. Leja
(74) *Attorney, Agent, or Firm*—Haynes and Boone, LLP

(57) ABSTRACT

An apparatus for redirecting electrostatic discharge currents includes a reference voltage member and an ESD susceptible system component. The ESD susceptible system component is electrically connected to the reference voltage member. An ESD receiving member is electrically connected to the reference voltage member. The ESD receiving member includes an ESD receiving portion positioned adjacent to the ESD susceptible system component. The ESD receiving member may be effectively used as a cost-effective stop gap solution in the manufacture of an electronic device adversely affected by electrostatic discharge until a long term solution is designed and implemented.

24 Claims, 3 Drawing Sheets

APPARATUS AND METHOD FOR REDIRECTING ELECTROSTATIC DISCHARGE CURRENTS VIA AN ALTERNATE PATH TO A REFERENCE VOLTAGE NODE

BACKGROUND

The disclosures herein relate generally to computer systems and more particularly to an apparatus and method for redirecting electrostatic discharge currents via an alternate path to a reference voltage node.

Electrostatic discharge (hereinafter referred to as ESD) is a problem in most electronic devices and contributes to field failures that are usually hard to investigate. Desktop computer systems, portable computer systems and other types of electronic devices are especially susceptible to ESD failures. Portable computers and keyboards are particularly susceptible to damage by ESD due to the repeated contact with the hands of a computer user. The hands of the computer user are a potential source of static charge. In addition to ESD failures associated with the use of an electronic device, ESD related failures also occur during manufacturing, shipping and set-up of electronic devices. These types of failures adversely affect the profit margin, manufacturer reputation and product warranty indexes.

The electronic components of many computer systems are highly susceptible to damage by ESD. Such discharges produce conducted transient currents in electronic devices that are carried through the circuitry. These conducted transient currents can occur via discharges through the seams in an enclosure, directly to the pins of a connector, or through secondary discharges from floating metal parts such as enclosure access panels. Catastrophic damage can occur to the circuitry of an electronic device as a result of ESD induced transient currents.

U.S. Pat. No. 4,837,657 discloses a device for conducting electrostatic discharge currents to a protection ground. The device includes an electrically conductive center section mounted on a substrate mounting device with the center section electrically connected to the protection ground. First and second arms, having an electrically conductive coating, extend from opposite sides of the center section. During the installation of a circuit substrate to the substrate mounting device, an associated arm is arranged to contact a metalized edge of the circuit substrate providing an electrical path for discharging electrostatic potentials from the circuit substrate to the protection ground.

U.S. Pat. No. 4,667,266 discloses a printed circuit board mounted inside the plastic housing of a piece of electrical equipment adjacent to a hole in the housing. The printed circuit board has a ground trace adapted to be connected to a source of ground potential. The ground trace is positioned on the printed circuit board so that, when the board is mounted in the housing, a portion of the ground trace is the nearest conductor to the hole. In this way, static discharges through the hole are prevented from damaging the equipment mounted on the printed circuit board.

Electronic devices such as computers must be resistant to, and preferably immune to, certain levels of ESD. This is particularly important for electronic devices sold in countries that maintain regulations for prescribed levels of ESD performance on certain electronic devices. In many instances, it is difficult to meet and maintain the specified levels of ESD performance. Acceptable levels of ESD performance are often difficult and expensive to achieve and maintain. Furthermore, even if the initial system design meets required ESD performance specifications, changes made during the life cycle of a product often adversely affect the ESD performance of the product.

Therefore, what is needed is a retrofitable apparatus for redirecting ESD currents from a current path through one or more electrical components susceptible to be damaged by ESD currents to an alternate, nondestructive current path.

SUMMARY

One embodiment, accordingly, provides an electronic device including an apparatus attachable to an electrically conductive reference voltage member of the electronic device and including a portion for being manually positioned adjacent to a system component of the electronic device. To this end, an electronic device includes a reference voltage member and an ESD susceptible system component. An ESD receiving member is electrically connected to the reference voltage member. The ESD receiving member includes an ESD receiving portion positioned adjacent to the ESD susceptible system component.

A principal advantage of this embodiment is that the apparatus may be used as a cost-effective stop gap solution in the manufacture of an affected electronic device until a long term solution is designed and implemented.

BRIEF DESCRIPTION OF THE DRAWINGS FIGURES

DETAILED DESCRIPTION

Figure 1:
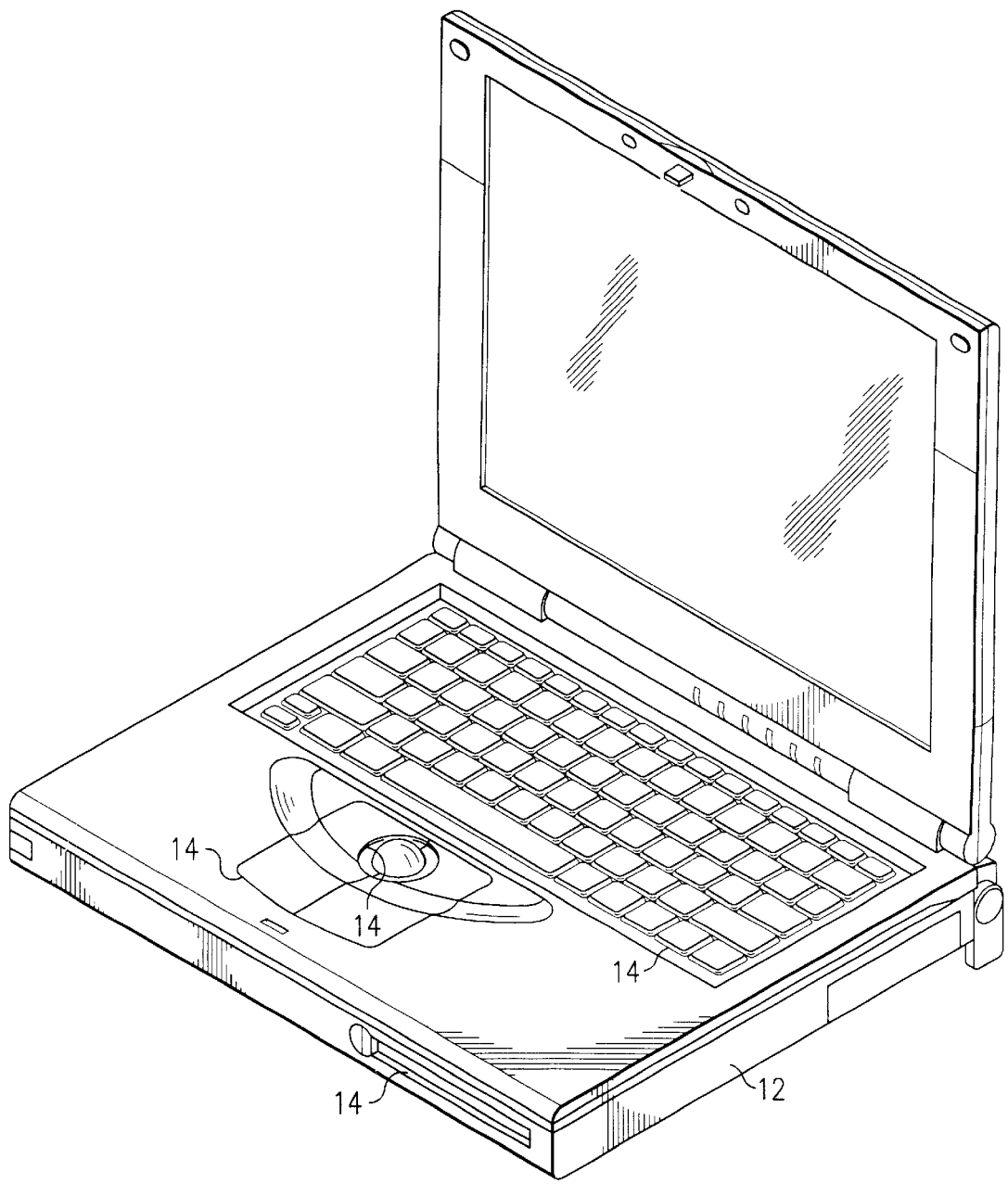
FIG. 1 is a perspective view illustrating an embodiment of a computer.

A portable computer is illustrated in FIG. 1, indicated generally at 10, and includes an enclosure 12. The portable computer 10 is one example of an electronic device that may be adversely affected by ESD. Other examples of electronic devices that are adversely affected by ESD include desktop computers, personal digital assistants, cellular telephones and the like. The enclosure 12 includes a plurality of electrostatic charge entry points 14. In general, the entry points 14 are defined by discontinuities in the enclosure 12 such as gaps between the enclosure 12 and various components of the portable computer 10.

Electrostatic charges have a tendency to enter into the enclosure 12 through one or more of the entry points 14. Once a sufficient level of electrostatic charge is accumulated at a particular location, ESD produces electrical currents that flow through a system component of an electronic device such as the portable computer 10. Depending on the sensitivity of the system component to ESD induced currents, failure or damage to the system component may result.

Figure 2:
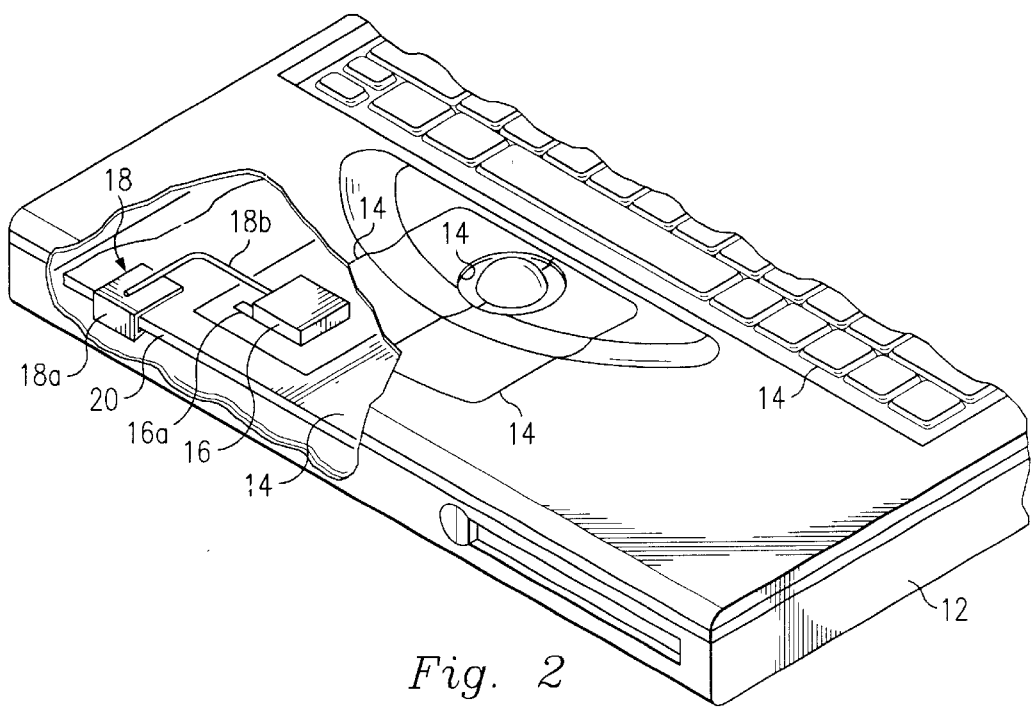
FIG. 2 is a fragmented perspective view illustrating a reference voltage member and an ESD sensitive component in the computer of FIG. 1.

Referring now to FIG. 2, one or more ESD susceptible system components 16 are mounted in the enclosure 12.

ESD susceptible system components include semiconductor devices, switches, controllers and other system components that are susceptible to damage by ESD. The ESD susceptible system component 16 is located adjacent to one of the entry points 14. An ESD receiving member 18 is mounted in the enclosure 12 for redirecting electrostatic discharge currents through an alternate path. The ESD receiving member 18 is electrically connected to a reference voltage member 20 such as, for example, a chassis ground node, the ground plane of a printed circuit substrate or a grounded keyboard support member. In preferred embodiments, the reference voltage member 20 is a chassis ground or other support member maintained at a ground potential.

The ESD receiving member 18 includes a base portion 18a and an ESD receiving portion 18b. The base portion 18a is attached to the reference voltage member 20 and the ESD receiving portion 18b is positioned in spaced apart relationship with respect to the ESD susceptible system component 16. The ESD receiving portion 18b is made of a material (discussed below) allowing it to be manually or mechanically formed to a desired shape. The ESD receiving member 18 provides a low resistance current path for ESD current to follow, reducing the possibility of discharge through an adjacent ESD susceptible system component 16.

The ESD susceptible system component 16 includes an exposed electrically conductive portion 16a, such as a lead or terminal, which is especially susceptible to ESD. The ESD receiving portion 18b of the ESD receiving member 18 is typically positioned adjacent to the exposed electrically conductive portion 16a of the ESD susceptible system component 16. To enhance the effectiveness of the ESD receiving member 18, the ESD receiving portion 18b is positioned to extend between the ESD susceptible component 16 and the nearest entry point 14, or the entry point 14 known to be the point of entry for electrostatic charges.

Figure 3:
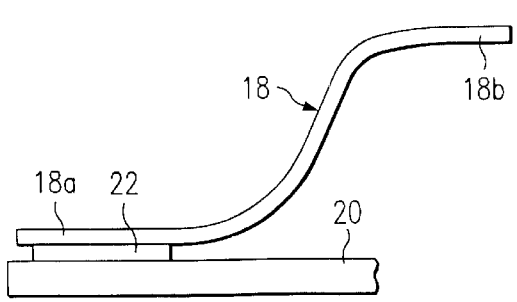
FIG. 3 is a side view illustrating an embodiment of an apparatus including an ESD receiving member mounted to a reference voltage member.
Figure 4:
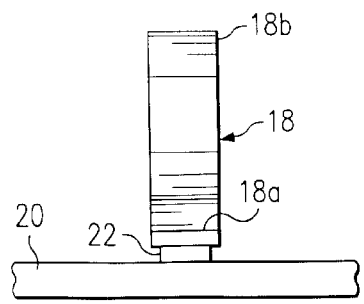
FIG. 4 is an end view of the apparatus of FIG. 3.

In one embodiment, FIGS. 3 and 4, the base portion 18a and the ESD receiving portion 18b of the ESD receiving member 18 are unitarily formed from a common piece of conformable electrically conductive material, such as copper foil. An electrically conductive adhesive 22 is applied between the base portion 18a and the reference voltage member 20 for facilitating an electrically conductive interface therebetween. The electrically conductive interface will typically have a resistance of approximately 50 milliohms or less. However, the exact interface resistance will vary depending on the specific nature of the application. The 3M Company of St. Paul, Minn., offers a suitable electrically conductive adhesive under the tradename 3M Electrically Conductive Adhesive Transfer Tape.

Figure 5:
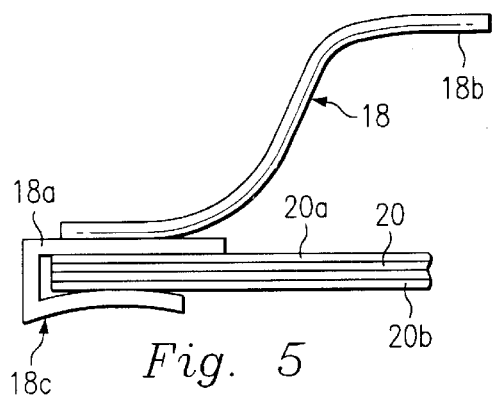
FIG. 5 is a side view illustrating another embodiment of an apparatus including an ESD receiving member mounted to a reference voltage member.
Figure 6:
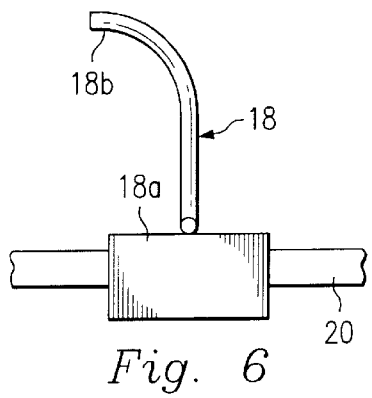
FIG. 6 is an end view of the apparatus of FIG. 5.

In another embodiment, FIGS. 5 and 6, the base portion 18a and the ESD receiving portion 18b of the ESD receiving member 18 are separately formed as discrete components and are subsequently attached to each other by a means such as spot welding or mechanical fastening. The base portion 18a is formed from a sheet of conductive material such as beryllium copper. The ESD receiving portion 18b is formed from a conformable electrically conductive material, such as copper wire. The base portion 18a is configured to include a clip 18c for being mechanically attached to the reference voltage member 20, such as a multi-layer printed circuit substrate including a dielectric layer 20a and a reference voltage plane 20b.

It is desirable for the ESD receiving portion 18b to be conformable in unrestricted orientations. For this reason, it is desirable to fabricate the ESD receiving portion 18b from a material having a cross section that permits bending in a plurality of axes. For example, a material with a round cross-section is preferred to a material with a thin, flat (sheet-like) cross-section in applications where bends in multiple axes are required.

The length of the ESD receiving portion 18b is a significant attribute of the ESD receiving portion 18b. Accordingly, it is desirable that the material for the ESD receiving member be able to be trimmed using common hand tools.

Figure 7:
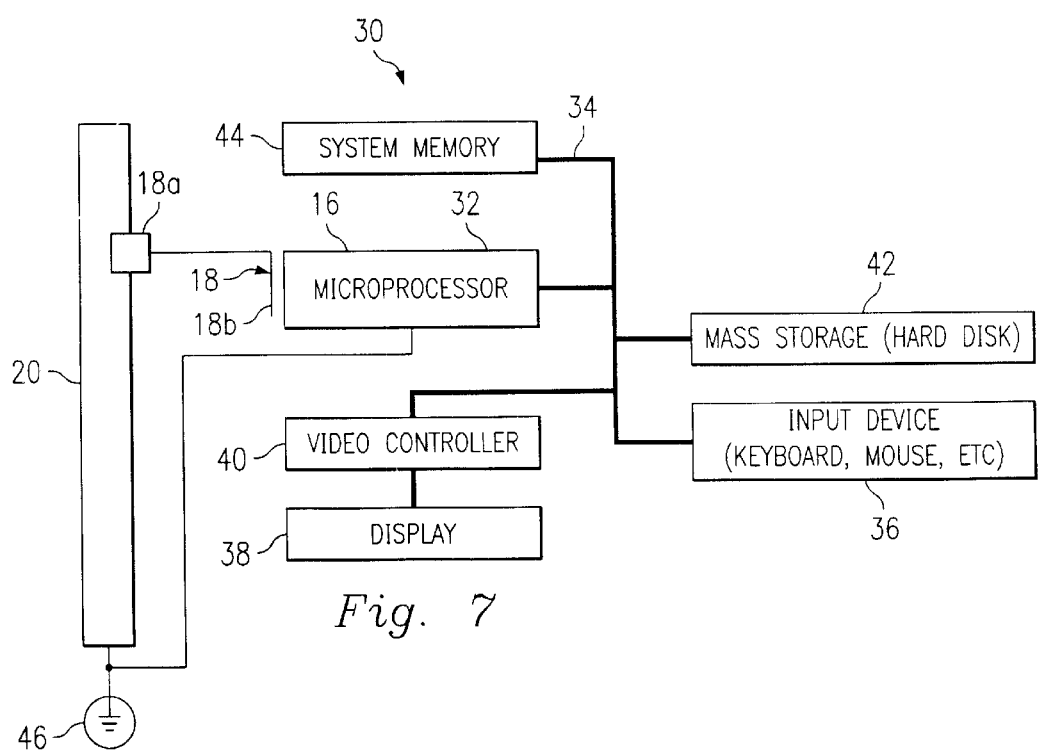
FIG. 7 is a block diagram view illustrating an embodiment of a computer system.

An embodiment of a computer system 30 is illustrated in FIG. 7. The computer system 30 includes at least one ESD susceptible system component 16 such as a microprocessor 32. The microprocessor 32 is connected to a signal bus 34. The signal bus 34 serves as a connection between the microprocessor 32 and other components of the computer system 30. One or more input devices 36 may be coupled to the microprocessor 32 to provide input to the microprocessor 32. Examples of input devices include keyboards, touchscreens, and pointing devices such as a mouse, a trackball and a trackpad. The computer system 30 may also include a display 38 which is coupled to the microprocessor 32 typically by a video controller 40. Programs and data are stored on a mass storage device 42 which is coupled to the microprocessor 32. Mass storage devices include components such as hard disks, optical disks, magneto-optical drives, floppy drives, and the like. A system memory 44 provides the microprocessor 32 with fast storage to facilitate execution of computer programs by the microprocessor 32. It should be understood that other busses and intermediate circuits can be employed between the components described above and microprocessor 32 to facilitate interconnection between the components and the microprocessor 32.

Still referring to FIG. 7, the ESD receiving portion 18b of the ESD receiving member 18 is positioned adjacent to and in spaced apart relationship with respect to the ESD susceptible system component 16, which in this example includes microprocessor 32. The base portion 18a of the ESD receiving member 18 is electrically connected to the reference voltage member 20. The reference voltage member 20 and the ESD susceptible system component 16 are both electrically connected to a common reference voltage node 46, such as an electrical ground location.

In operation, the base portion 18a of the ESD receiving member 18 is electrically connected to the reference voltage member 20. The ESD receiving portion 18b of the ESD receiving member 18 is positioned adjacent to and in spaced apart relationship with respect to the ESD susceptible system component 16. Subsequent to entry of electrostatic charge into the enclosure 12, typically through an entry point 14 adjacent to the ESD susceptible system component 16, the electrostatic charge arcs (discharges) to the ESD receiving portion 18b of the ESD receiving member 18. The discharge of the electrostatic charge produces an electrical current that flows through the ESD receiving member 18, reference voltage member 20, and reference voltage node 46. By directing the flow of the ESD current through a current path defined by the ESD receiving member 18, the potential for damage to the adjacent ESD susceptible system component 16 is greatly reduced.

One embodiment provides an electronic device including a reference voltage member and an ESD susceptible system component electrically connected to the reference voltage member. An ESD receiving member is electrically connected to the reference voltage member. The ESD receiving member includes an ESD receiving portion positioned adjacent to the ESD susceptible system component.

Another embodiment provides a computer system including an enclosure and a reference voltage member mounted in the enclosure. A plurality of system components are mounted in the enclosure and are electrically connected to the reference voltage member. A first one of the system components is a microprocessor. At least one of the system components is an ESD susceptible system component. An input is coupled to provide input to the microprocessor. A display is coupled to the microprocessor by a video controller. A mass storage is coupled to the microprocessor. A second one of the system components is a system memory coupled to provide storage to facilitate execution of computer programs by the microprocessor. An ESD receiving member is electrically connected to the reference voltage member. The ESD receiving member includes an ESD receiving portion positioned adjacent to the ESD susceptible system component.

A further embodiment provides a method of redirecting electrostatic discharge currents through an alternate path. The method includes mounting a reference voltage member and an ESD susceptible system component in an enclosure. The ESD susceptible system component is electrically connected to the reference voltage member. An ESD receiving member is electrically connected to the reference voltage member. An ESD receiving portion of the ESD receiving member is manually positioned adjacent to an ESD susceptible system component mounted in the enclosure.

As it can be seen, the embodiments presented herein provide several advantages. The ESD receiving members may be used as a cost-effective stop gap solution in the manufacture of an affected electronic device until a long term solution is designed and implemented. The ESD receiving members are inexpensive to manufacture and install. The design and installation of the ESD receiving members are generally universal for many types and models of electronic devices. The ESD receiving members can be used as a design solution for electronic devices manufactured for a specific portion of the global market or for a particular customer. The installed cost of the ESD receiving members is relatively inexpensive. The ESD receiving members reduce variability associated with the installation process. The ESD receiving members can be manufactured using a variety of different cost-effective techniques and materials. The ESD receiving portion of the ESD receiving member may be made of a material permitting the length and shape of the ESD receiving portion to be quickly and easily altered before or during installation.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for redirecting static discharge currents, comprising:
    a reference voltage member;
    an ESD susceptible system component electrically connected to the reference voltage member;
    an exposed electrically conductive lead extending from the ESD susceptible system component; and
    an ESD receiving member electrically connected to the reference voltage member, the ESD receiving member including an ESD receiving portion positioned adjacent to the conductive lead of the ESD susceptible system component.

2. The apparatus of claim 1 wherein the ESD receiving portion of the ESD receiving member is in spaced apart relationship with respect to the ESD susceptible system component.

3. The apparatus of claim 1 wherein the ESD susceptible system component includes an exposed electrically conductive portion, and wherein the ESD receiving portion of the ESD receiving member is positioned adjacent to the exposed electrically conductive portion of the ESD susceptible system component.

4. The apparatus of claim 1 further comprising:
    an enclosure including a discontinuity therein defining an electrostatic charge entry point in the enclosure, the ESD receiving portion of the ESD receiving member being positioned adjacent to the discontinuity.

5. The apparatus of claim 4 wherein the ESD susceptible system component is positioned adjacent to the discontinuity.

6. The apparatus of claim 4 wherein the ESD receiving portion of the ESD receiving member is positioned between the discontinuity and the ESD susceptible component.

7. The apparatus of claim 1 wherein the ESD receiving member includes an electrically conductive base portion electrically connected to the ESD receiving portion.

8. The apparatus of claim 7 wherein the base portion includes a clip portion electrically connected to the reference voltage member.

9. The apparatus of claim 7 further comprising: a layer of electrically conductive adhesive between the base portion of the ESD receiving member and the reference voltage member.

10. The apparatus of claim 1 wherein the ESD receiving portion is made of a manually conformable electrically conductive material.

11. The apparatus of claim 1 wherein the reference voltage member includes a chassis of an electronic device.

12. The apparatus of claim 1 wherein the reference voltage member includes a keyboard support member.

13. The apparatus of claim 1 wherein the reference voltage member includes a reference voltage plane of a printed circuit substrate.

14. A computer system, comprising:
    an enclosure;
    a reference voltage member mounted in the enclosure;
    a plurality of system components mounted in the enclosure and electrically connected to the reference voltage member, a first one of the system components being a microprocessor, a second one of the system components being a system memory coupled to provide storage to facilitate execution of computer programs by the microprocessor, at least one of the system components being an ESD susceptible system component;
    an exposed electrically conductive lead extending from the ESD susceptible system component;
    an input coupled to provide input to the microprocessor;
    a display coupled to the microprocessor by a video controller;
    a mass storage coupled to the microprocessor; and
    an ESD receiving member electrically connected to the reference voltage member, the ESD receiving member including an ESD receiving portion positioned adjacent to the conductive lead of the ESD susceptible system component.

15. The computer system of claim 14 wherein the ESD receiving portion of the ESD receiving member is in spaced apart relationship with respect to the ESD susceptible system component.

16. The computer system of claim 14 wherein the ESD susceptible system component includes an exposed electrically conductive portion, and wherein the ESD receiving portion of the ESD receiving member is positioned adjacent to the exposed electrically conductive portion of the ESD susceptible system component.

17. The computer system of claim 14 wherein the enclosure includes a discontinuity defining an electrostatic charge entry point in the enclosure, and wherein the ESD receiving portion of the ESD receiving member is positioned adjacent to the discontinuity.

18. The computer system of claim 17 wherein the ESD susceptible system component is positioned adjacent to the discontinuity.

19. The computer system of claim 17 wherein the ESD receiving portion of the ESD receiving member is positioned between the discontinuity and the ESD susceptible component.

20. The computer system of claim 14 wherein the ESD receiving member includes an electrically conductive base portion connected to the ESD receiving portion.

21. The computer system of claim 20 wherein the base portion includes a clip portion electrically connected to the reference voltage member.

22. The computer system of claim 20 further comprising:
a layer of electrically conductive adhesive between the base portion of the ESD receiving member and the reference voltage member.

23. The computer system of claim 14 wherein the ESD receiving portion is made of a conformable electrically conductive material.

24. A method of redirecting electrostatic discharge currents through an alternate path, comprising:
mounting a reference voltage member and an ESD susceptible system component in an enclosure;
electrically connecting the ESD susceptible system component to the reference voltage member;
extending an exposed electrically conductive lead from the ESD susceptible system component;
electrically connecting an ESD receiving member to the reference voltage member; and
manually positioning a conformable ESD receiving portion of the ESD receiving member adjacent to the conductive lead of the ESD susceptible system component mounted in the enclosure.

* * * * *